(12) United States Patent
Panesar et al.

(10) Patent No.: US 11,816,016 B2
(45) Date of Patent: Nov. 14, 2023

(54) IDENTIFYING CAUSES OF ANOMALIES OBSERVED IN AN INTEGRATED CIRCUIT CHIP

(71) Applicant: Siemens Industry Software Inc., Plano, TX (US)

(72) Inventors: Gajinder Panesar, Cambridge (GB); Marcin Hlond, Cambridge (GB)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/780,837

(22) PCT Filed: Nov. 26, 2020

(86) PCT No.: PCT/EP2020/083479
§ 371 (c)(1),
(2) Date: May 27, 2022

(87) PCT Pub. No.: WO2021/110530
PCT Pub. Date: Jun. 10, 2021

(65) Prior Publication Data
US 2023/0004471 A1    Jan. 5, 2023

(30) Foreign Application Priority Data
Dec. 3, 2019   (GB) ..................................... 1917652

(51) Int. Cl.
*G06F 11/00*     (2006.01)
*G06F 11/34*     (2006.01)
*G01R 31/3185*   (2006.01)

(52) U.S. Cl.
CPC .... *G06F 11/348* (2013.01); *G01R 31/318513* (2013.01); *G06F 11/349* (2013.01)

(58) Field of Classification Search
CPC ............... G06F 11/079; G06F 11/0751; G06F 11/3452; G06F 11/348; G06F 11/3476; G06F 11/3058
See application file for complete search history.

(56) References Cited

U.S. PATENT DOCUMENTS

| 2015/0269014 | A1 | 9/2015 | Nakatsugawa et al. |
| 2016/0164721 | A1* | 6/2016 | Zhang ................... H04L 41/142 709/224 |

(Continued)

FOREIGN PATENT DOCUMENTS

| JP | 2013214171 A | 10/2013 |
| JP | 2015184818 A | 10/2015 |

(Continued)

OTHER PUBLICATIONS

PCT International Search Report and Written Opinion of International Searching Authority dated Mar. 16, 2021 corresponding to PCT International Application No. PCT/EP2020/083479 filed Nov. 26, 2020, pp. 1-15.

*Primary Examiner* — Charles Ehne
(74) *Attorney, Agent, or Firm* — Lempia Summerfield Katz LLC

(57) ABSTRACT

A method of identifying a cause of an anomalous feature measured from system circuitry on an integrated circuit (IC) chip, the IC chip comprising the system circuitry and monitoring circuitry for monitoring the system circuitry by measuring features of the system circuitry in each window of a series of windows, the method comprising: (i) from a set of windows prior to the anomalous window comprising the anomalous feature, identifying a candidate window set in which to search for the cause of the anomalous feature; (ii) for each of the measured features of the system circuitry: (a) calculating a first feature probability distribution of that measured feature for the candidate window set; (b) calcu- (Continued)

lating a second feature probability distribution of that measured feature for window(s) not in the candidate window set; (c) comparing the first and second feature probability distributions; and (d) identifying that measured feature in the timeframe of the candidate window set as a cause of the anomalous feature if the first and second feature probability distributions differ by more than a threshold value; (iii) iterating steps (i) and (ii) for further candidate window sets from the set of windows prior to the anomalous window; and (iv) outputting a signal indicating those measured feature(s) of step (ii)(d) identified as a cause of the anomalous feature.

19 Claims, 12 Drawing Sheets

(56) References Cited

U.S. PATENT DOCUMENTS

| | | |
|---|---|---|
| 2016/0210556 A1 | 7/2016 | Ben Simhon et al. |
| 2016/0217022 A1* | 7/2016 | Velipasaoglu ...... G06F 11/0709 |
| 2019/0050515 A1 | 2/2019 | Su et al. |
| 2019/0102553 A1 | 4/2019 | Herwadkar et al. |
| 2019/0243743 A1 | 8/2019 | Saxena et al. |
| 2019/0340392 A1 | 11/2019 | Khorrami et al. |
| 2020/0068052 A1* | 2/2020 | Huddleston ............ G06N 3/049 |
| 2021/0095996 A1* | 4/2021 | Gvd ........................ G01D 1/00 |

FOREIGN PATENT DOCUMENTS

| | | |
|---|---|---|
| JP | 2017207903 A | 11/2017 |
| WO | 2011065354 A1 | 6/2011 |

\* cited by examiner

IDENTIFYING CAUSES OF ANOMALIES OBSERVED IN AN INTEGRATED CIRCUIT CHIP

FIELD OF THE INVENTION

This invention relates to analysing features measured from system circuitry within a System-on-Chip (SoC) or multi-chip module (MCM).

BACKGROUND

In the past, an embedded system which had multiple core devices (processors, memories etc.) would have been incorporated onto a Printed Circuit Board (PCB) and connected on the PCB via buses. Traffic in the embedded system was conveyed over these buses. This arrangement was convenient for monitoring the core devices, because monitoring tools such as oscilloscopes and logic analysers could be attached to the PCB's buses allowing direct access to the core devices.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses, thus connection of monitoring tools directly to the system bus is no longer possible. The resulting reduced access coupled with an increasing quantity of data being transported around the chip (due to developments of SoC technology leading to integration of multiple processing cores and higher internal clocking frequencies), has reduced the ability of external monitoring tools to monitor the system for security breaches, bugs, and safety concerns within the timescales demanded by the industry. Additionally, when multiple core devices are embedded onto the same single chip, the behaviour of each individual core device differs from its behaviour in isolation due to its interaction with the other core devices as well as real time events such as triggers and alerts.

Thus, the development of SoC devices required associated development in monitoring technology, which lead to the integration of some monitoring functionality onto the SoC. It is now known for monitoring circuitry within the SoC to trace the output of processors executing programs on core devices (such as CPUs). The trace data is generally output for analysis off-chip.

It would be desirable to generate more detailed analysis of the data gathered by on-chip monitoring circuitry, in particular to investigate anomalies in the data.

SUMMARY OF THE INVENTION

According to a first aspect, there is provided a method of identifying a cause of an anomalous feature measured from system circuitry on an integrated circuit (IC) chip, the IC chip comprising the system circuitry and monitoring circuitry for monitoring the system circuitry by measuring features of the system circuitry in each window of a series of windows, the method comprising: (i) from a set of windows prior to the anomalous window comprising the anomalous feature, identifying a candidate window set in which to search for the cause of the anomalous feature; (ii) for each of the measured features of the system circuitry: (a) calculating a first feature probability distribution of that measured feature for the candidate window set; (b) calculating a second feature probability distribution of that measured feature for window(s) not in the candidate window set; (c) comparing the first and second feature probability distributions; and (d) identifying that measured feature in the timeframe of the candidate window set as a cause of the anomalous feature if the first and second feature probability distributions differ by more than a threshold value; (iii) iterating steps (i) and (ii) for further candidate window sets from the set of windows prior to the anomalous window; and (iv) outputting a signal indicating those measured feature(s) of step (ii)(d) identified as a cause of the anomalous feature.

Step (ii)(c) may comprise determining a difference measure between the first feature probability distribution and the second feature probability distribution; and step (ii)(d) may comprise identifying that the measured feature in the timeframe of the candidate window set is a cause of the anomalous feature if that difference measure is greater than the threshold value.

The difference measure may be scaled by a percentile of the difference over time between first and second feature probability distributions of the iterations.

The set of windows prior to the anomalous window may be bounded by (i) the anomalous window, and (ii) a distal earlier window.

Step (ii)(b) may comprise calculating the second feature probability distribution of that measured feature fora set of windows between the candidate window set and the anomalous window.

The candidate window set may comprise fewer than 10 windows.

The candidate window set may comprise a single window only.

The first and second feature probability distributions may be calculated in steps (ii)(a) and (b) by fitting a Gaussian model to the measured feature for the identified windows.

The method may further comprise identifying a measured feature affected by the anomalous feature, the affected measured feature being in a window subsequent to the anomalous window, the method comprising: (v) from a set of windows subsequent to the anomalous window, identifying a subsequent candidate window set in which to search for an effect of the anomalous feature; (vi) for each of the measured features of the system circuitry: (a) calculating a third feature probability distribution of that measured feature for the subsequent candidate window set; (b) calculating a fourth feature probability distribution of that measured feature for subsequent window(s) not in the subsequent candidate window set; (c) comparing the third and fourth feature probability distributions; and (d) identifying that measured feature in the timeframe of the subsequent candidate window set as affected by the anomalous feature if the third and fourth feature probability distributions differ by more than a further threshold value; and (vii) iterating steps (v) and (vi) for further subsequent candidate window sets from the set of windows subsequent to the anomalous window; and (viii) outputting a signal indicating those measured feature(s) of step (vi)(d) identified as affected by the anomalous feature.

Step (vi)(c) may comprise determining a further difference measure between the third feature probability distribution and the fourth feature probability distribution; and step (vi)(d) may comprise identifying that the measured feature in the timeframe of the subsequent candidate window set is affected by the anomalous feature if that further difference measure is greater than the further threshold value.

The further difference measure may be a scaled difference over time between the third and fourth feature probability distributions.

The set of windows subsequent to the anomalous window may be bounded by (i) the anomalous window, and (ii) a distal later window.

Step (vi)(b) may comprise calculating the fourth feature probability distribution of that measured feature for a set of windows between the subsequent candidate window set and the anomalous window.

The subsequent candidate window set may comprise fewer than 10 windows.

The subsequent candidate window set may comprise a single window only.

The third and fourth feature probability distributions may be calculated in steps (vi)(a) and (b) by fitting a Gaussian model to the measured feature for the identified windows.

The measured features may include those derived from trace data generated by the monitoring circuitry from data outputted by components of the system circuitry.

The measured features may include those derived from match events identified by the monitoring circuitry from data inputted to or outputted from components of the system circuitry.

The measured features may include those derived from counters of the monitoring circuitry configured to count every time a specific item is observed from components of the system circuitry.

BRIEF DESCRIPTION OF THE FIGURES

The present invention will now be described by way of example with reference to the accompanying drawings. In the drawings.

DETAILED DESCRIPTION

The following disclosure describes a monitoring architecture suitable for implementation on an integrated circuit chip. The integrated circuit chip may be a SoC or a multi-chip module (MCM).

Figure 1:
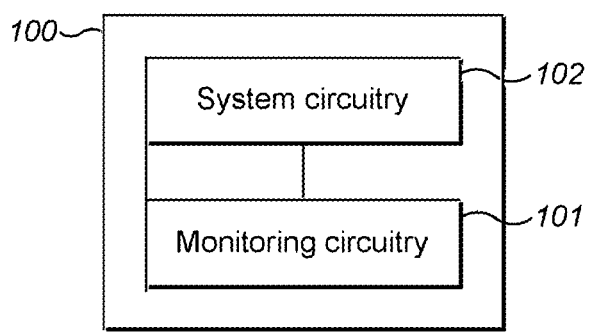
FIG. 1 is a schematic drawing of an exemplary integrated circuit chip device.
Figure 2:
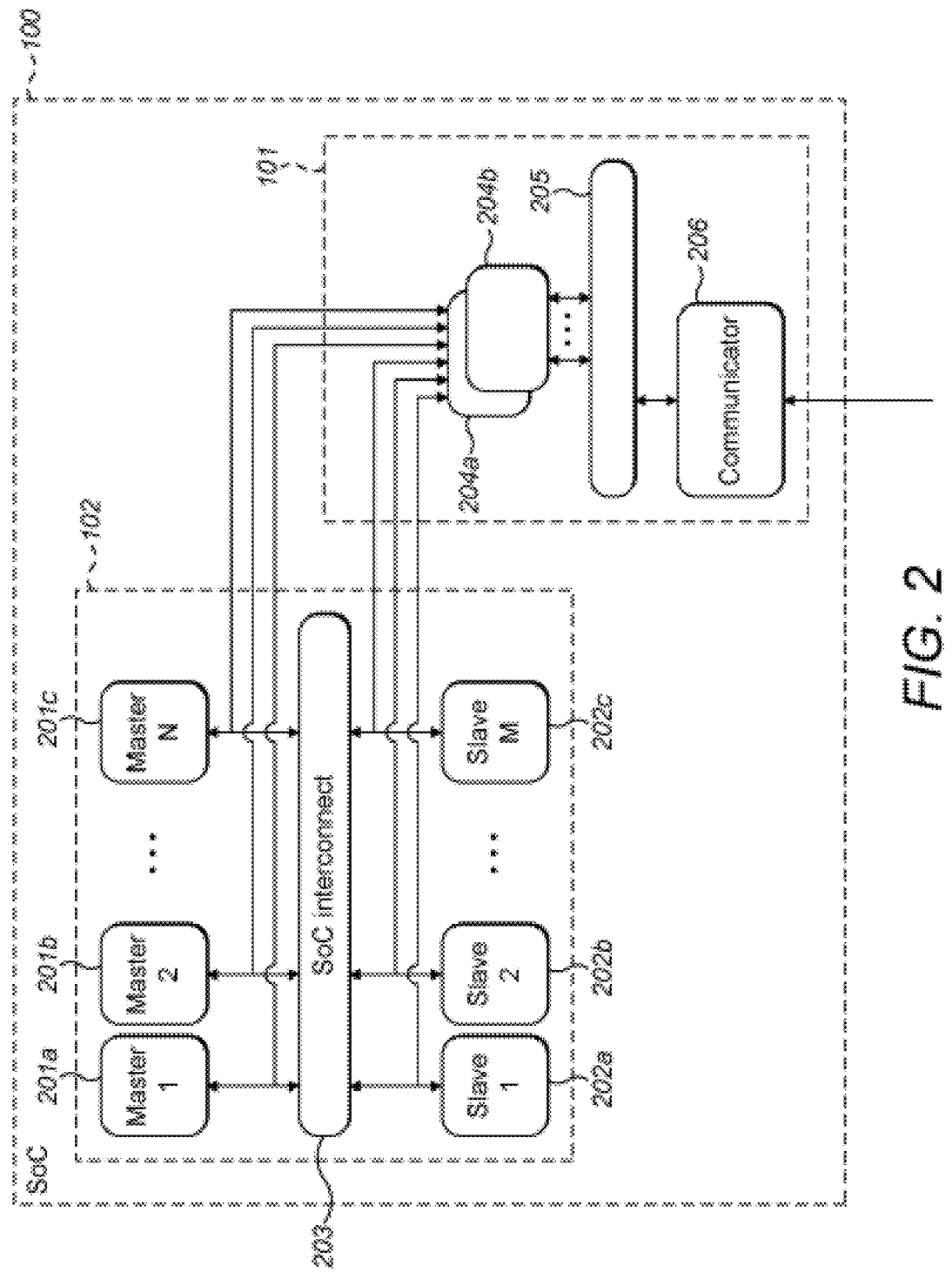
FIG. 2 is a schematic drawing of an exemplary monitoring network and system circuitry on an integrated circuit chip device.
Figure 3:
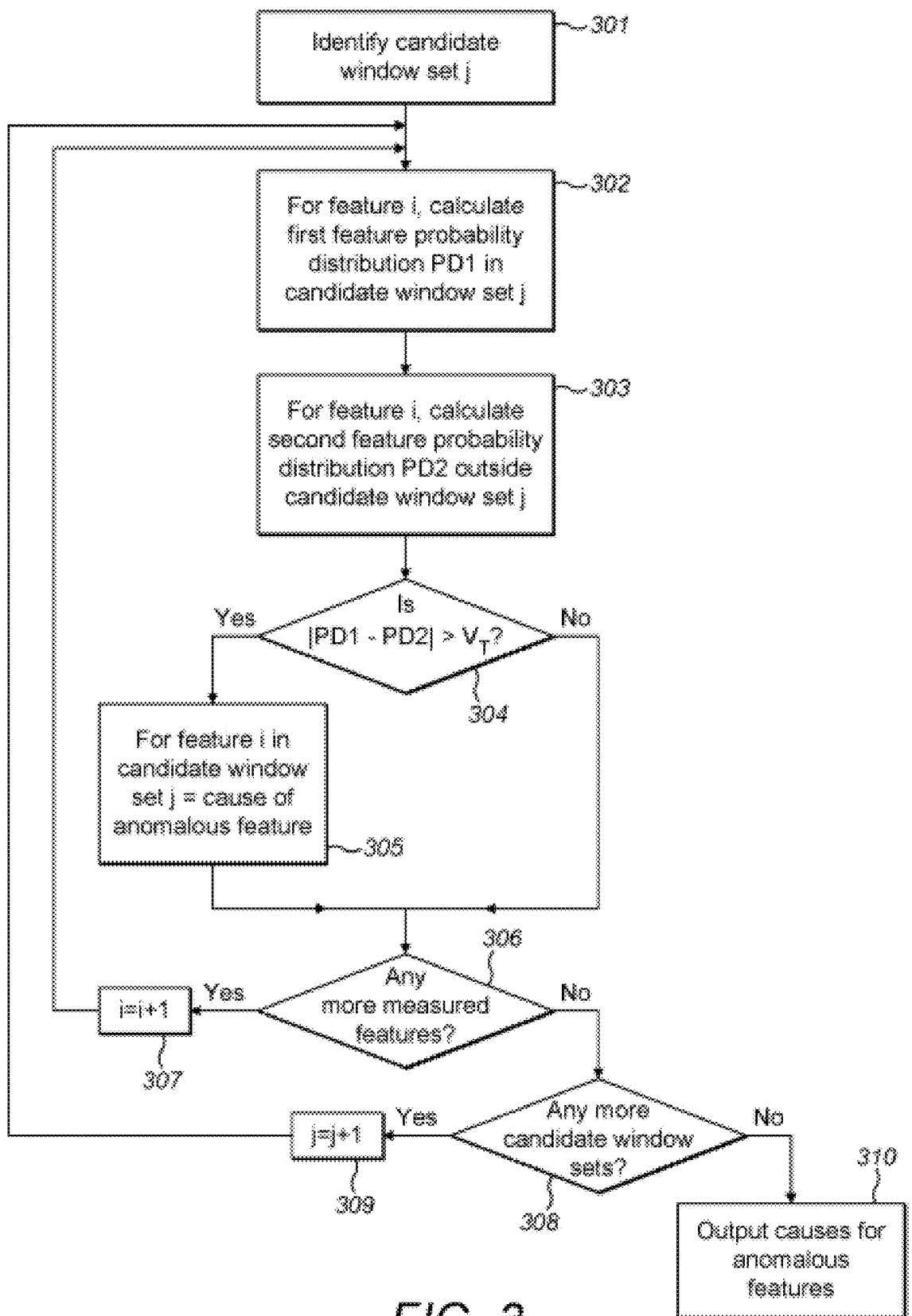
FIG. 3 is a flowchart of a method of identifying a cause of an anomalous feature measured from system circuitry.
Figure 6:
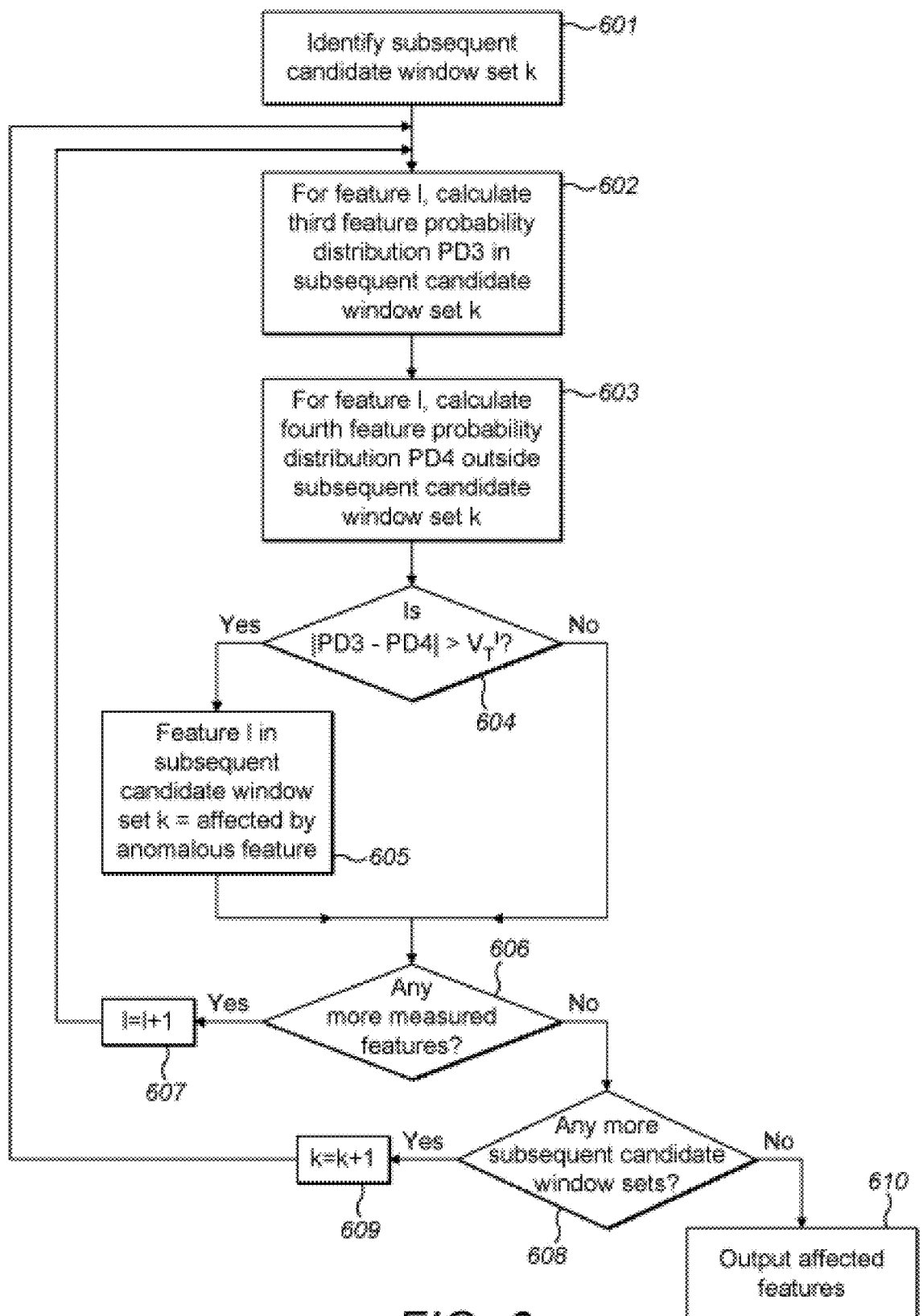
FIG. 6 is a flowchart of a method of identifying subsequent measured features affected by an anomalous feature measured from system circuitry.

FIGS. 1 and 2 are schematic diagrams of exemplary system architectures, and components within the system architectures. These figures present the structures in terms of functional blocks. Some functional blocks for carrying out functions well known in the art have in places been omitted from these figures. FIGS. 3 and 6 are flowcharts illustrating methods of analysing statistical data measured by the monitoring circuitry. Each flowchart depicts an order in which the method of that flowchart can be performed. However, the flowcharts are not intended to restrict the described methods to being implemented in the orders depicted. The steps of the methods may be carried out in alternative orders to those depicted in the flowcharts.

FIG. 1 illustrates the general structure of an exemplary monitoring network for a SoC 100. Monitoring circuitry 101 is arranged to monitor system circuitry 102. For example, for the purposes of detecting improper operation of the core devices relating to safety or security concerns.

FIG. 2 illustrates exemplary system circuitry comprising core devices 201, 202 connected via a SoC interconnect 203. Core devices 201a, 201b, 201c are master devices. Core devices 202a, 202b, 202c are slave devices. Any number of core devices can be suitably integrated into the system circuitry, as indicated by the numbering of the master and slave devices as 1, 2, ... N on FIG. 2. The SoC interconnect 203 forms a communication backbone for the SoC, through which the master and slave devices communicate with each other. These communications are bi-directional.

Master devices are those which initiate traffic, such as read/write requests in a network. Examples of master devices are processors such as a DSP (digital signal processor), video processor, applications processor, CPU (central processor unit), and GPU (graphics processor unit). Any programmable processor may be a master device. Other examples of master devices are those with DMA (direct memory access) capability, such as conventional DMAs for moving data from one location to another, autonomous coprocessors with DMA capability (such as an encryption engine), and peripherals with DMA capability (such as an Ethernet controller).

Slave devices are those which respond to the commands of the master devices. Examples of slave devices are on-chip memories, memory controllers for off-chip memories (such as DRAM), and peripheral units.

The topology of the SoC interconnect 203 is SoC dependent. For example, it may comprise any one or combination of the following types of network to transport communications around the system circuitry: a bus network, a ring network, a tree network, or a mesh network.

The monitoring circuitry 101 comprises monitoring units 204a, 204b connected to a communicator 206 via a monitoring interconnect 205.

Any number of monitoring units can be integrated into the monitoring circuitry. Each monitoring unit is connected to a communication link between a master device and a slave device. This connection may be between a master device and the SoC interconnect, for example at the interface between the master device and the SoC interconnect. The connection may be between the SoC interconnect and a slave device, for example at the interface between the slave device and the SoC interconnect. Each monitoring unit may be connected to a single communication link. Alternatively, one or more monitoring units of the monitoring circuitry 101 may be connected to a plurality of communication links. The monitoring units 204 monitor the operation of the core devices by monitoring the communications on the monitored communication links. Optionally, the monitoring units may also be able to manipulate the operation of the core devices that they are monitoring.

The communicator 206 may be an interface for communicating with entities off-chip. For example, monitoring circuitry 101 may communicate with an off-chip analyser via communicator 206. Communicator 206 may additionally or alternatively be configured to communicate with other entities on-chip. For example, monitoring circuitry 101 may communicate with an on-chip analyser via communicator 206. Although FIG. 2 illustrates one communicator 206, any number of communicators can be integrated onto the SoC. The communicators implemented are chosen in dependence on the type of connections that are to be made. Exemplary communicators include: JTAG, parallel trace input/output, and Aurora based high-speed serial interface; and reuse of system interfaces such as USB, Ethernet, RS232, PCIe and CAN.

The topology of the monitoring interconnect 205 may comprise any one or combination of the following types of network to transport communications around the monitoring circuitry: a bus network, a ring network, a tree network, or a mesh network. The communication links between the monitoring units 204 and the communicator 206 are bi-directional.

As described above, the monitoring units 204 of FIG. 2 monitor the communications between the master 201 and slave 202 devices. The monitoring units may gather statistics from the communications that they monitor. The statistics gathered and the time windows over which this is done are configurable. For example, each monitoring unit 204 may receive a configuration command(s) from an on-chip or off-chip analyser commanding the monitoring unit to monitor specific communication parameters. The analyser may also specify the length of the time windows over which the parameters are to be monitored. The analyser may also specify when the collected data is to be reported to the analyser. Typically, the analyser requires the collected data to be reported periodically.

Thus, a monitoring unit 204 may be configured to monitor the communications of its connected component (be that a master device 201 or a slave device 202) over a series of monitored time windows. The length of each monitored time window may be specified by the analyser as described above. The monitored time windows may be non-overlapping. For example, the monitored time windows may be contiguous. Alternatively, the monitored time windows may be overlapping.

Examples of data which may be generated by a monitoring unit observing one or more components of system circuitry include:
  Trace data. The generated trace data may be a copy of data observed by the monitoring unit. For example, a copy of an instruction sequence executed by a CPU, or a set of transactions on a bus.
  Match data. The monitoring unit may be configured to monitor the system circuitry for occurrences of specific events. On identifying the specific event, the monitoring unit generates match data. The monitoring unit may output this match data immediately to the analyser.
  Counter data. The monitoring unit may comprise one or more counters. Each counter is configured to count occurrences of a specific event. The count value of the counter may be periodically output to the analyser.

The raw data generated by the monitoring units is suitably converted to a set of measured features for each window of a series of time windows. Each measured feature has a value for each window.

Examples of measured features include:
  Aggregated bandwidth captured from a bus. This may be split into an aggregated bandwidth for read operations, and separately an aggregated bandwidth for write operations.
  The maximum latency, minimum latency, and/or average latencies from read operations captured from a bus.
  The number of address match events. In other words, the number of accesses to a selected memory region.
  From software execution trace, in each separate thread: (i) the aggregated time spent in the thread; and/or (ii) the minimum, maximum, and/or average thread interval times; and/or (iii) the number of thread schedule events, optionally specifying from which thread it took over.
  From software execution trace, the number of interrupts, and/or the minimum, maximum and/or average time spent in interrupt handlers.
  From CPU instruction trace, the number of instructions executed, optionally grouped into instruction classes which may include branches.

The conversion of raw data to measured features may be by any method known in the art. This conversion may be carried out by the monitoring circuitry 101 on-chip. Alternatively, the conversion may be carried out by the analyser which may be on-chip or off-chip. Data obtained from sources other than monitoring units 204 may be used in combination with the raw data generated by the monitoring units in generating the measured features. The time windows into which the measured features are aggregated may have a length between 1 ms and 1000 ms. The time windows into which the measured features are aggregated may have a length between 10 ms and 100 ms.

The measured features in the series of time windows may then be input to an anomaly detection method to identify any of those measured features which are anomalous. The anomaly detection method is likely carried out by the analyser. However, alternatively, the anomaly detection method may be carried out by the monitoring circuitry 101.

In a first example, anomaly detection is carried out with a model trained from known good sequences. In this example, the model captures the behaviour of a series of time windows whose measured features are known not to be anomalous. Building the model comprises constructing a feature distribution for each feature. For example, a kernel density estimator (KDE) may be used to build the distribution. The KDE starts with a flat zero line and adds a small gaussian kernel for the value of each feature from each window of the series of time windows. Each feature value contributes the same amount to the distribution. The final values may then be scaled. The result is a feature distribution indicative of the likelihood of a particular value of a feature representing normal behaviour. The model thus comprises a set of feature distributions representing normal behaviour of those features.

Subsequent sequences can then be compared against the model. The subsequent sequence comprises a series of time windows whose measured features are not known to be anomalous or not anomalous. A subsequent sequence may be compared to the model by comparing an individual window of the subsequent sequence to the model. In this case, the value of the model feature distribution corresponding to the value of the feature in the individual window is determined. If the value of the distribution indicates a low likelihood of that feature value being normal behaviour, then the feature is determined to be anomalous in the individual window. For example, if the value of the distribution is below a threshold value, then the feature is determined to be anomalous in the individual window. The threshold values may be different for different features.

The anomalous features are outputted as an electrical signal to a user (for example as a visual signal on a screen).

If two or more anomalous features are identified, then these may be ranked in the output signal. The anomalous features may be ranked in order of their value below the threshold value, with anomalous feature which is furthest below the threshold value being ranked first, and the anomalous feature which is closest below the threshold ranked last.

A subsequent sequence may be compared to the model by first constructing a feature distribution for each feature of the subsequent sequence. For example a KDE may be used to generate each feature distribution as described above with respect to the generation of the model. The difference between the model feature distribution and the subsequent sequence feature distribution for each feature is then taken. If, for a feature, the average difference between these two feature distributions is greater than a threshold, then that feature in the subsequent sequence is determined to contain an anomaly.

The anomalous features are outputted as an electrical signal to a user (for example as a visual signal on a screen). If two or more anomalous features are identified, then these may be ranked in the output signal. The anomalous features may be ranked in order of their average differences between the model feature distribution and the subsequence sequence feature distribution, the anomalous feature with the greatest average difference being ranked first, and the anomalous feature with the smallest average difference being ranked last.

In a second example, anomaly detection is carried out without utilising the behaviour of a series of time windows whose measured features are known not to be anomalous. Anomaly detection is carried out on a sequence comprising a series of time windows of measured features. Those measured features are not known to be anomalous or not anomalous. This example comprises constructing a feature distribution for each feature of the sequence. This may be carried out using a KDE as described above with respect to the first example. The lowest values in the feature distribution for each feature are identified as potentially anomalous. These potentially anomalous features are outputted as an electrical signal to a user (for example as a visual signal on a screen). The user may reject the identified features as not anomalous or accept the identified features as anomalous. The user may also flag other features as anomalous manually.

The outputted anomalous features may be grouped into anomalous windows. The anomalous windows may be ranked in order of their likelihoods across all features, with the anomalous window having the lowest likelihood of representing normal behaviour across all features being ranked first, and the anomalous window having the highest likelihood of representing normal behaviour across all features being ranked last.

Suitably, several iterations of the chosen anomaly detection method are carried out, each iteration using a different time window length. For example, a range of time window lengths from 10 ms to 100 ms may be utilised in the iterations. This may enable an anomaly resulting from a temporal property that is observed more readily within a particular window length to be identified. Within each iteration, the time windows may be non-overlapping. For example, the time windows may be contiguous. Alternatively, the time windows may be overlapping.

A method will now be described for identifying causes of anomalous features in the activities of components on a SoC with reference to FIG. 3. Those anomalous features have been identified using an anomaly detection method (such as one of the ones described above). The method described with reference to FIG. 3 is carried out at a processor. Suitably, this processor is located at an analyser. The analyser may be on the SoC 100. Alternatively, the analyser may be an off-chip component. The processor may alternatively be located in the monitoring circuitry 101 of the SoC.

The processor receives as an input a sequence of measured features. The processor also receives as an input one or more time windows which are identified as having at least one anomalous feature in them. The anomalous feature(s) itself may, optionally, be identified. The processor uses these inputs to search for possible causes of the anomalous feature(s) in the time windows which precede the anomalous window(s).

Figure 4:
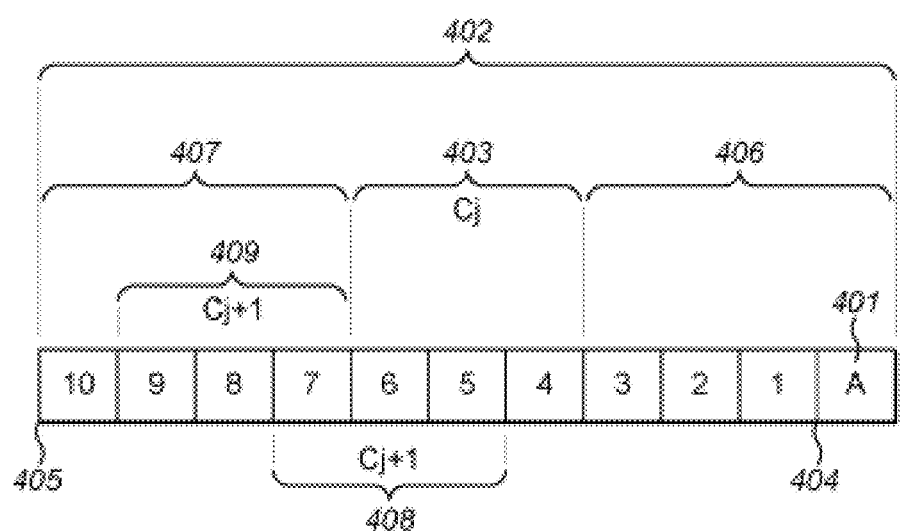
FIG. 4 illustrates time windows of a sequence of measured features.

At step 301, the processor selects a candidate window set j in which to search for a cause of the anomalous feature. For each anomalous window, the processor selects one or more window to add to the candidate window set j. For each anomalous window, the window(s) added to the candidate window set j are selected from the anomalous window and the set of windows which precedes the anomalous window in the sequence of measured features. FIG. 4 illustrates an example sequence of measured features. An anomalous window is labelled 401. For this anomalous window, the window(s) which the processor adds to the candidate window set j are selected from the windows labelled 402. This set of windows 402 is bounded by: (i) the anomalous window 404, and (ii) a distal earlier window 405. The distal earlier window is the earliest window in which a cause for the anomalous feature is to be searched. For ease of illustration, only 10 windows are shown preceding the anomalous window 401. In practice, the set of windows 402 may include up to 1000 windows. For example, the set of windows 402 may include 100 windows. The windows Cj added to the candidate window set j for the anomalous window 401 are labelled 403. The length of the windows Cj added to the candidate window set j is configurable. The length of the windows Cj may be a single window only. Alternatively, the length of the windows Cj may include two or more windows. The length of the windows Cj may include up to 10 windows. In the example of FIG. 4, the length of the windows Cj is shown as including three windows: windows 4, 5 and 6. The processor selects windows Cj to add to the candidate window set j for each anomalous window in the sequence of measured features. For example, in this iteration, the processor may add three windows to the candidate window set j for each anomalous window, those three windows being consecutive windows which are 4 to 6 windows back from the anomalous window.

Following step 301, the processor moves to step 302. At step 302, for a measured feature i, the processor calculates a first feature probability distribution PD1 of that measured feature i for the candidate window set j.

At step 303, the processor calculates, for each measured feature i, a second feature probability distribution PD2 of that measured feature i for windows in the sequence but not in the candidate window set j. The second feature probability distribution PD2 may be calculated for a set of windows which includes all the windows 402 which are not in the candidate window set j.

Steps 302 and 303 may be carried out concurrently. Alternatively, step 302 may precede step 303 as shown in FIG. 3. Alternatively, step 303 may precede step 302.

The first and second feature probability distributions may be calculated by the processor applying the KDE method described above to the identified windows of the sequence of measured features. Alternatively, the first and second feature probability distributions may be calculated by the processor by fitting a Gaussian Mixture model to the identified windows of the sequence of measured features. There are likely to be only a small number of windows prior to the anomalous window in which a further anomaly is identified. The Gaussian Mixture model generates a simpler distribution than the KDE model, which is more effective with fewer data points, and thus may be preferred here. Alternatively, a different model known in the art may be used to generate the first and second feature probability distributions.

Having calculated the first and second feature probability distributions at steps 302 and 303, the processor compares the two distributions at step 304. A large difference between the distributions is indicative of that feature being a cause or contributor to the anomaly observed in the anomalous window. Thus, the processor determines whether the first and second feature probability distributions differ by more than a threshold value Vt. If, at step 304, the first and second feature probability distributions PD1 and PD2 differ by more than the threshold value Vt, then the processor moves to step 305, wherein it identifies the feature i in the candidate window set j as a cause of the anomalous feature in the anomalous window. If, at step 304, the first and second feature probability distributions PD1 and PD2 differ by less than the threshold value Vt, then the processor does not identify the feature i in the candidate window set j as a cause of the anomalous feature in the anomalous window.

In order to assess whether the first and second feature probability distributions differ by more than a threshold value, the processor may determine a difference measure between the two probability distributions. The difference measure is a single value. That single value may represent the average difference between the probability distributions. In other words, the average difference between the number of features observed at each feature value in the two distributions. Alternatively, that single value may represent the total difference between the probability distributions. In other words, the total difference between the number of features observed at each feature value in the two distributions. The difference measure may be calculated by any method known in the art. That difference measure |PD1-PD2| is then compared to the threshold value Vt at step 304.

The processor then moves on to step 306. At step 306, the processor determines whether there are any more measured features which the method of FIG. 3 has not yet been applied to in respect of candidate window set j. If there are more measured features, then the processor moves to step 307, where the next measured feature is selected. The processor then repeats steps 302 to 306 for that next measured feature for the candidate window set j. If, at step 306, the processor determines that there are no further measured features, then it moves to step 308.

At step 308, the processor determines whether there are any more candidate window sets which the method of FIG. 3 has not yet been applied to. The next candidate window set j+1 may be overlapping with the candidate window set j. For example, for the next candidate window set j+1, for each anomalous window, the processor may select different window or window(s) to add to the candidate window set j+1 to the window(s) it selected to add to the candidate window set j. As with candidate window set j, for each anomalous window, the window(s) added to the candidate window set j+1 are selected from the anomalous window and the set of windows which precedes the anomalous window in the sequence of measured features. Referring to FIG. 4, the window(s) Cj+1 which the processor adds to the candidate window set j+1 for the anomalous window 401 are labelled 408 and exclusively includes windows 5, 6 and 7. In this example, windows 5 and 6 of candidate window set j+1 overlap with candidate window set j. Alternatively, the next candidate window set j+1 may not overlap with the candidate window set j, but be contiguous with it. For example, referring to FIG. 4, the window(s) Cj+1 which the processor adds to the candidate window set j+1 for the anomalous window 401 are labelled 409 and includes windows 7, 8 and 9. In this example, there are no overlapping windows of candidate window set j+1 and candidate window set j selected in respect of the anomalous window 401. Once the iteration has reached the distal earlier window 405, then there are no further candidate window sets.

If at step 308 it is determined that there are more candidate window sets, then the processor moves to step 309, where the next candidate window set is selected. The processor then repeats steps 302 to 308 for the next candidate window set. If at step 308 it is determined that there are no more candidate window sets, then the processor moves to step 310, where it outputs the identified causes (if any) of the anomalous feature of the anomalous window.

Figure 5:
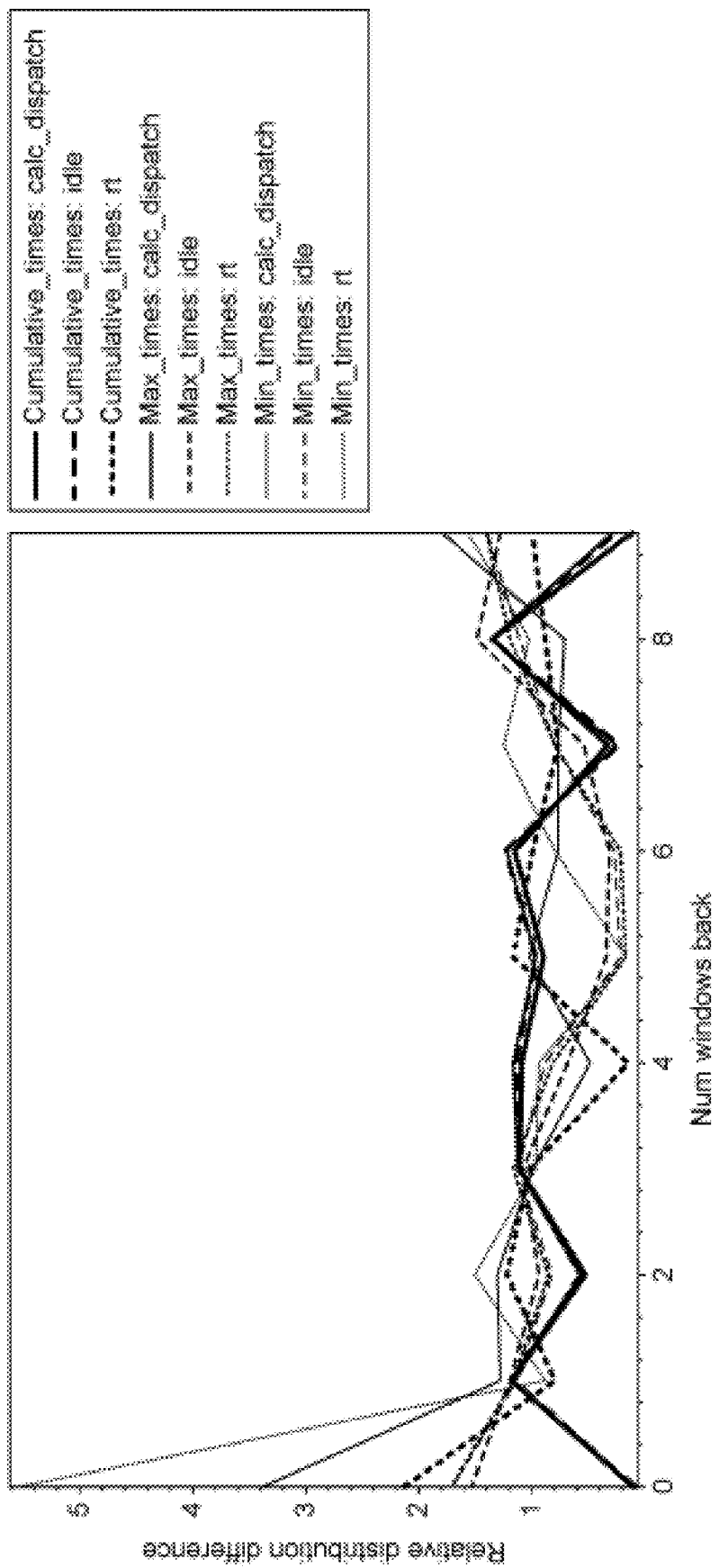
FIG. 5 is a graph depicting features which are the cause of subsequent anomalous features.

At step 310, the cause(s) of the anomalous feature may be outputted as an electrical signal to a user (for example as a visual signal on a screen of the analyser). For example, a graph such as the one illustrated in FIG. 5 may be outputted to the screen. The graph of FIG. 5 illustrates several plots. Each plot is of a scaled difference measure between the first and second feature distributions for a measured feature (on the y-axis) plotted against the number of windows back in time from the anomalous window (on the x-axis). The number of windows back in time may be taken as the window of the candidate window set which is closest to the anomalous window. For example, looking at FIG. 4, the scaled difference measure between the first and second feature probability distributions for the candidate window set j would be marked at three windows back in time on the x-axis.

Difference measures are not consistent between different measured features. For example, cumulative times may be consistently more variable than memory saturation. Since FIG. 5 plots the difference measures of all the measured features on one graph, the difference measures are scaled such that they can be compared. Thus, the difference measures provide a relative measure for the different measured features. For example, the difference measures may be scaled by a percentile of their difference over time. For example, the difference measures may be scaled by the $50^{th}$ percentile.

By plotting the scaled difference measures over a time offset from the anomalous window, the measured feature(s) which are causes of the anomalous feature are readily apparent to the user. A large scaled difference for a measured feature at a specific number of windows back in time indicates a high likelihood of a cause occurring in that measured feature at that number of windows back in time.

The graph of FIG. 5 illustrates the method of FIG. 3 carried out on software thread switching data. The first and second feature probability distributions were each generated using a Gaussian Mixture Model (GMM). The candidate window set had a single window. The relative GMM distribution difference is used as the difference measure. The graph suggests that the rt thread close in time to the anomalous window is a cause of the anomalous feature. This is shown by the measured differences for the maximum and minimum rt times being substantially greater in the 0 to 1 window range than the measured differences for other features.

A corresponding method to that described with reference to FIG. 3 may also be applied to windows after the anomalous window in the sequence of measured features. This method is illustrated in FIG. 6, and can be used to identify a subsequent measured feature which has been affected by the anomalous feature in the anomalous window. The method of FIG. 6 is carried out at the same processor that carries out the method of FIG. 3.

As with FIG. 3, for the method of FIG. 6, the processor receives as an input the sequence of measured features, and one or more time windows which are identified as having at least one anomalous feature in them. The processor uses these inputs to search for subsequent features in subsequent time windows after the anomalous window which have been affected by the anomalous feature.

Figure 7:
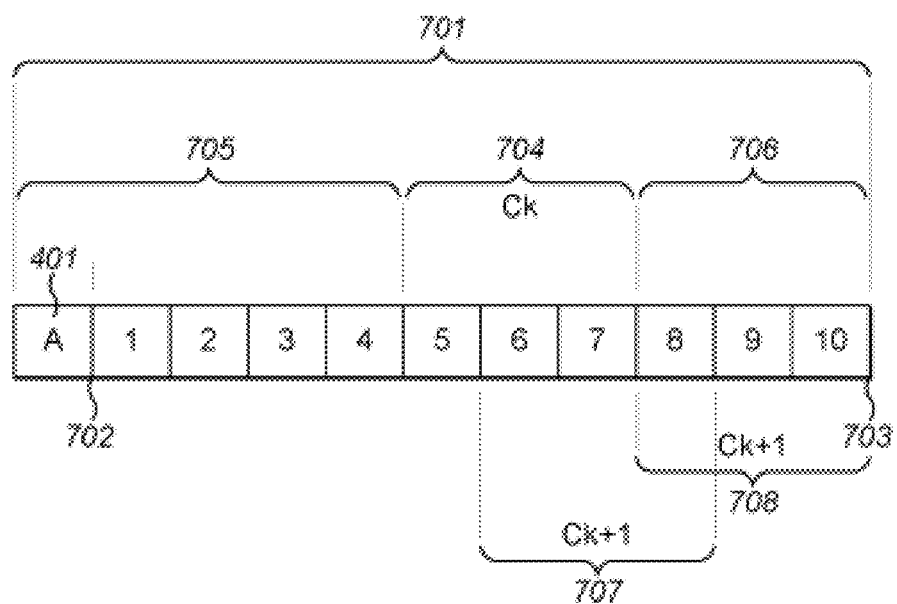
FIG. 7 illustrates time windows of a sequence of measured features.

At step 601, the processor selects a subsequent candidate window set k in which to search for a measured feature affected by the anomalous feature. For each anomalous window, the processor selects one or more window to add to the subsequent candidate window set k. For each anomalous window, the window(s) added to the subsequent candidate window set k are selected from the anomalous window and the set of windows which follows the anomalous window in the sequence of measured features. FIG. 7 illustrates an example sequence of measured features. An anomalous window is labelled 401. For this anomalous window, the window(s) which the processor adds to the subsequent candidate window set j are selected from the windows labelled 701. This set of windows 701 is bounded by: (i) the anomalous window 702, and (ii) a distal later window 703. The distal later window 703 is the latest window in which an effect of the anomalous feature is to be searched. For ease of illustration, only 10 windows are shown after the anomalous window 401. In practice, the set of windows 701 may include up to 1000 windows. For example, the set of windows 701 may include 100 windows. The windows Ck added to the subsequent candidate window set k for the anomalous window 401 are labelled 704. The length of the windows Ck added to the subsequent candidate window set k is configurable. The length of the windows Ck may be a single window only. Alternatively, the length of the windows Ck may include two or more windows. The length of the windows Ck may include up to 10 windows. In the example of FIG. 7, the length of the windows Ck is shown as including three windows: windows 5, 6 and 7. The processor selects windows Ck to add to the subsequent candidate window set k for each anomalous window in the sequence of measured features. For example, in this iteration, the processor may add three windows to the candidate window set k for each anomalous window, those three windows being consecutive windows which are 5 to 7 windows ahead of the anomalous window.

Following step 601, the processor moves to step 602. At step 602, for a measured feature I, the processor calculates a third feature probability distribution PD3 of that measured feature I for the subsequent candidate window set k.

At step 603, the processor calculates, for each measured feature I, a fourth feature probability distribution PD4 of that measured feature I for windows in the sequence but not in the subsequent candidate window set k. The fourth feature probability distribution PD4 may be calculated for a set of windows which includes all the windows 701 which are not in the subsequent candidate window set k 704.

Steps 602 and 603 may be carried out concurrently. Alternatively, step 602 may precede step 603 as shown in FIG. 3. Alternatively, step 603 may precede step 602.

The third and fourth feature probability distributions may be calculated by the processor using any of the methods described above with respect to the first and second feature probability distributions.

Having calculated the third and fourth feature probability distributions at steps 602 and 603, the processor compares the two distributions at step 604. A large difference between the distributions is indicative of that feature being affected by the anomaly observed in the anomalous window. Thus, the processor determines whether the third and fourth feature probability distributions differ by more than a threshold value Vt'. If, at step 604, the third and fourth feature probability distributions PD3 and PD4 differ by more than the threshold value Vt', then the processor moves to step 605, wherein it identifies the feature I in the subsequent candidate window set k as affected by the anomalous feature in the anomalous window. If, at step 604, the third and fourth feature probability distributions PD3 and PD4 differ by less than the threshold value Vt', then the processor does not identify the feature I in the subsequent candidate window set k as affected by the anomalous feature in the anomalous window.

In order to assess whether the third and fourth feature probability distributions differ by more than a threshold value, the processor may determine a difference measure between the two probability distributions. This difference measure may be calculated as described above with reference to the first and second feature probability distributions of FIG. 3.

The processor then moves on to step 606. At step 606, the processor determines whether there are any more measured features which the method of FIG. 6 has not yet been applied to in respect of subsequent candidate window set k. If there are more measured features, then the processor moves to step 607, where the next measured feature is selected. The processor then repeats steps 602 to 606 for that next measured feature for the subsequent candidate window set k. If, at step 606, the processor determines that there are no further measured features, then it moves to step 608.

At step 608, the processor determines whether there are any more subsequent candidate window sets which the method of FIG. 6 has not yet been applied to. The next subsequent candidate window set k+1 may be overlapping with the subsequent candidate window set k. For example, for the next candidate window set k+1, for each anomalous window, the processor may select different window or window(s) to add to the subsequent candidate window set k+1 to the window(s) it selected to add to the subsequent candidate window set k. As with subsequent candidate window set k, for each anomalous window, the window(s) added to the subsequent candidate window set k+1 are selected from the anomalous window and the set of windows after the anomalous window in the sequence of measure features. Referring to FIG. 7, the window(s) Ck+1 which the processor adds to the subsequent candidate window set k+1 for the anomalous window 401 are labelled 707 and exclusively includes windows 6, 7 and 8. In this example, windows 6 and 7 of subsequent candidate window set k+1 overlap with subsequent candidate window set k. Alternatively, the next subsequent candidate window set k+1 may not overlap with the subsequent candidate window set k, but be contiguous with it. For example, referring to FIG. 7, the window(s) Ck+1 which the processor adds to the subsequent candidate window set k+1 for the anomalous window 401 are labelled 708 and includes windows 8, 9 and 10. In this example, there are no overlapping windows of subsequent candidate window set k+1 and subsequent candidate window set k selected in respect of the anomalous window 401. Once the iteration has reached the distal later window 703, then there are no further subsequent candidate window sets.

If at step 608 it is determined that there are more subsequent candidate window sets, then the processor moves to step 609, where the next subsequent candidate window set is selected. The processor then repeats steps 602 to 608 for the next subsequent candidate window set. If at step 608 it is determined that there are no more subsequent candidate window sets, then the processor moves to step 610, where it outputs the measured features identified as affected by the anomalous feature of the anomalous window.

At step 610, the affected measured features may be outputted as an electrical signal to a user (for example as a visual signal on a screen of the analyser). For example, a graph corresponding to FIG. 5 may be outputted which illustrates scaled difference measures between the third and fourth feature distributions for a measured feature (on the y-axis) plotted against the number of windows forwards in time from the anomalous window (on the x-axis). The number of windows forward in time may be taken as the window of the subsequent candidate window set which is closest to the anomalous window. For example, looking at FIG. 7, the scaled difference measure between the third and fourth feature probability distributions for the subsequent candidate window set k would be marked at four windows forward in time on the x-axis. The difference measures may be scaled in the same manner described with reference to FIGS. 3 and 5.

Figure 8:
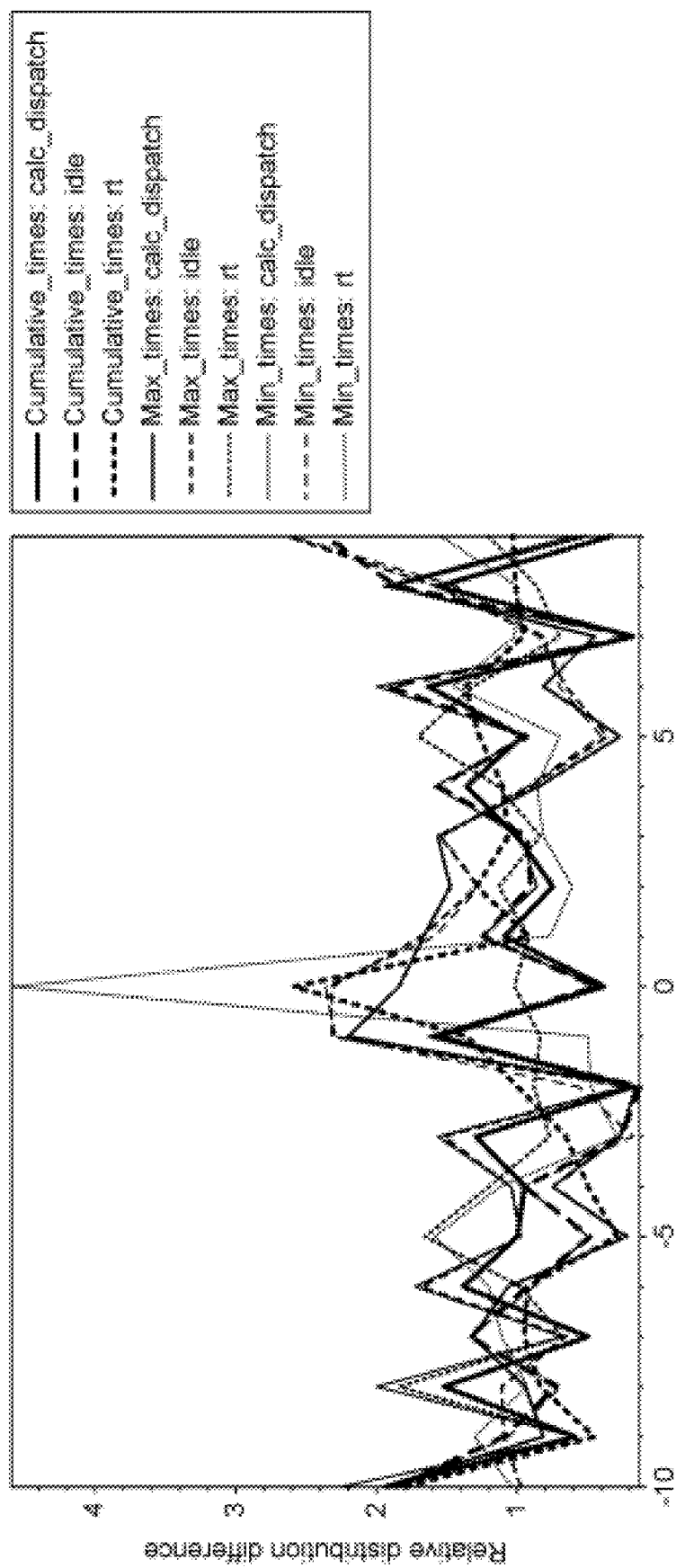
FIG. 8 is a graph depicting both features which are the cause of subsequent anomalous features and also features which are affected by the anomalous features.

FIG. 8 is a graph illustrating the result of both the methods described with reference to FIGS. 3 and 6 having been carried out on the same sequence of measured features, which is the same sequence of measured features used to generate the graph of FIG. 5. These methods may have been carried out separately, as described above. Alternatively, the methods may have been carried out together as a single method, with the candidate window sets in FIG. 3 including both windows from before and after the anomalous windows. In the graph of FIG. 8, the measured features i are the same feature types as the measured features I. The length of the candidate window set j is the same as the length of the subsequent candidate window set k. As with FIG. 5, the feature probability distributions were all generated using Gaussian Mixture Models, and the (subsequent) candidate window set had a single window. As with FIG. 5, the graph of FIG. 8 suggests that the rt thread close in time to the anomalous window is a cause of the anomalous feature, and also that the rt thread following the anomalous window is affected by the anomalous feature. This is shown by the measured differences for the minimum rt times being substantially greater in the −1 to 1 window range than the measured differences for other features.

Figure 9A:
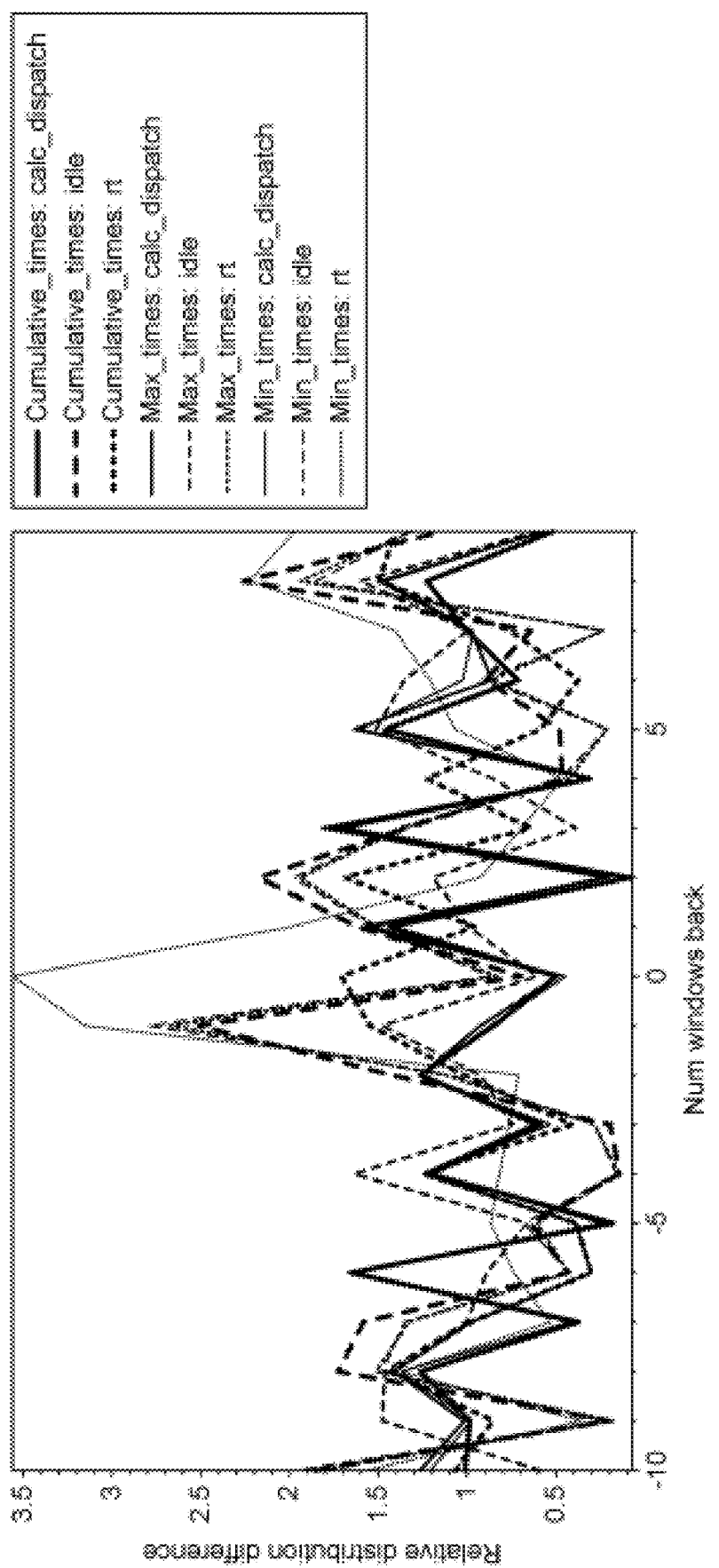
FIGS. 9a, b, c and d are graphs depicting both features which are the cause of subsequent anomalous features and also features which are affected by the anomalous features, for different length candidate window sets.
Figure 9B:
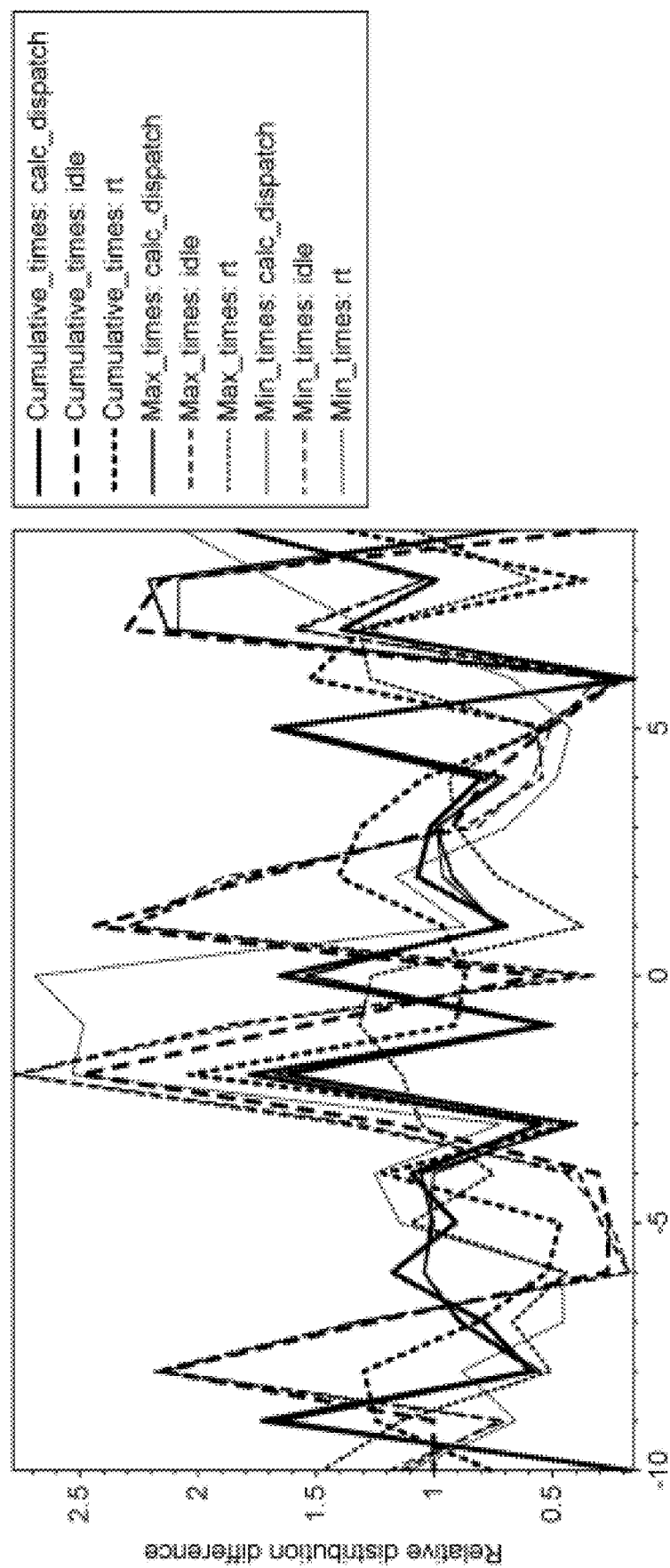
Figure 9C:
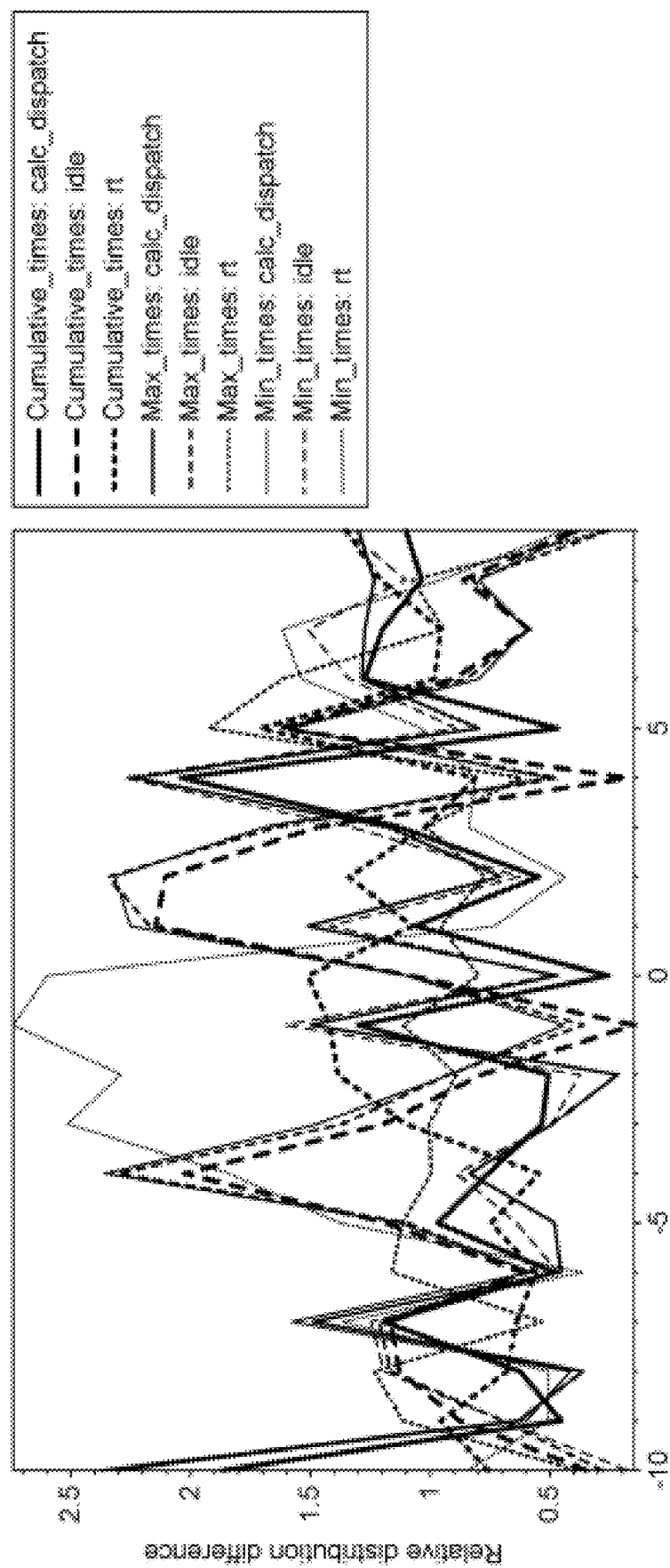
Figure 9D:
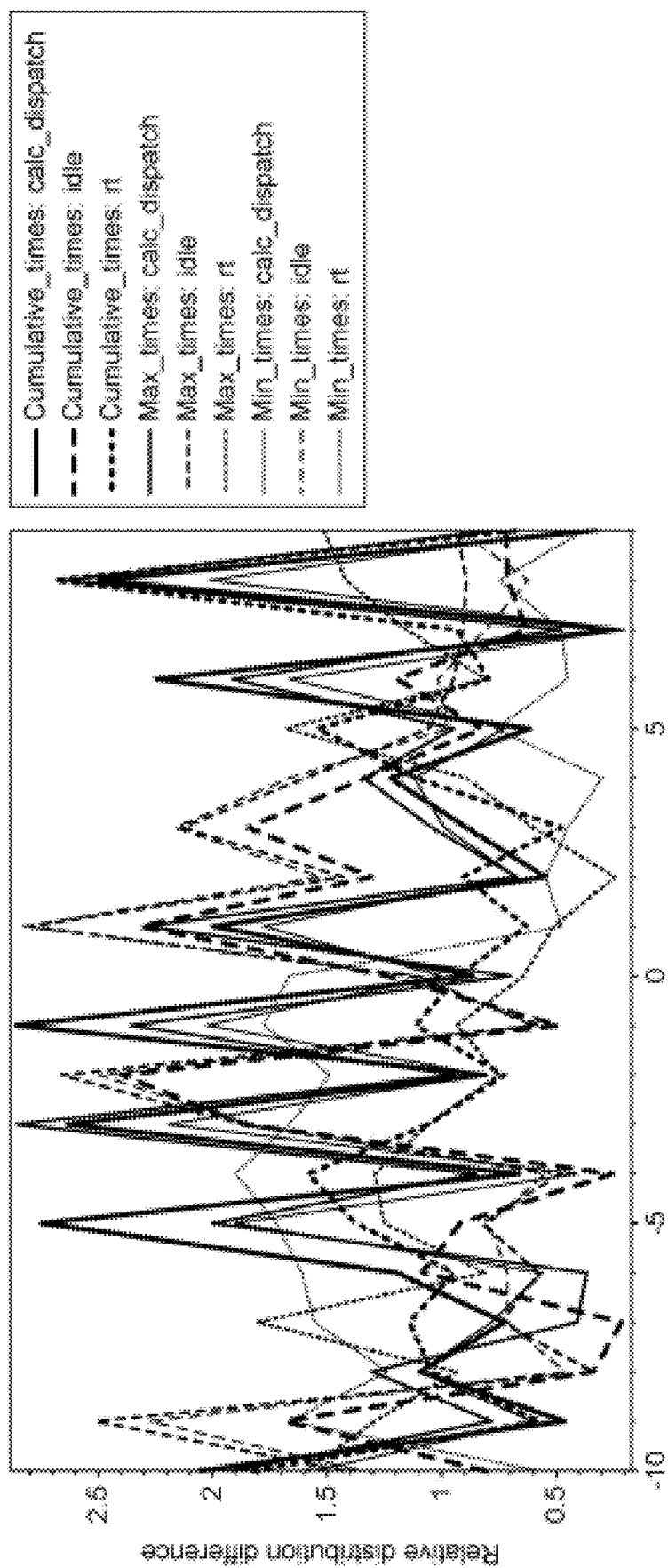

Both FIGS. 5 and 8 were generated in respect of a processor performing the methods described with reference to FIGS. 3 and 6 using (subsequent) candidate window sets having a single window only. The number of windows in the (subsequent) candidate window sets may be greater than one. This may make the methods less sensitive to the exact point in time at which the error(s) occur. The methods implemented to produce FIG. 8 were repeated with (subsequent) candidate window set lengths of 2, 3, 5 and 10 windows, the results of which are shown in FIGS. 9a, b, c and d respectively. These figures illustrate that the rt thread is readily identifiable as a cause and affected feature in respect of a (subsequent) candidate window set length of 2 windows. The rt thread is identifiable as a cause and affected feature in respect of (subsequent) candidate window set lengths of 3 and 5 windows. However, with the (subsequent) candidate window set length of 10 windows of FIG. 9d, the feature probability distribution of the (subsequent) candidate window set is too similar to the feature probability distribution of the windows outside the (subsequent) candidate window set for the rt thread to be identified as a cause and affected feature.

Monitoring circuitry on an IC chip, such as that shown in FIG. 2, can generate a huge quantity of monitored data. The methods described herein provide a way of analysing that data to identify causes of anomalous features measured from system circuitry, and subsequent features affected by the anomalous features. These methods can be implemented in real-time as the system circuitry continues to perform its functions. Alternatively, these methods can be implemented at a later time, off-line.

Anomaly detection is applicable to a wide range of fields, in financial, commercial, business, industrial and engineering markets. Exemplary use of the methods described herein are: for security monitoring such as fraud detection or intrusion detection, safety monitoring, preventative maintenance for industrial devices such as sensors, and performance monitoring.

Each component of the SoCs illustrated in FIGS. 1 and 2 may be implemented in dedicated hardware. Alternatively, each component of the SoC illustrated in FIGS. 1 and 2 may be implemented in software. Some components may be implemented in software, whilst other components are implemented in dedicated hardware.

The SoC described is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. The methods described herein may be performed by software in machine readable form on a tangible storage medium. Software can be provided at the computing-based device to implement the methods described herein.

The above description describes the system circuitry and monitoring circuitry as being comprised on the same SoC. In an alternative implementation, the system circuitry and monitoring circuitry are comprised across two or more integrated circuit chips of an MCM. In an MCM, the integrated circuit chips are typically stacked or located adjacently on an interposer substrate. Some system circuitry may be located on one integrated circuit chip and other system circuitry located on a different integrated circuit chip of the MCM. Similarly, the monitoring circuitry may be distributed across more than one integrated circuit chip of the MCM. Thus, the method and apparatus described above in the context of a SoC also apply in the context of an MCM.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of identifying a cause of an anomalous feature measured from system circuitry on an integrated circuit (IC) chip, the IC chip comprising the system circuitry and monitoring circuitry for monitoring the system circuitry by measuring features of the system circuitry in each window of a series of windows, the method comprising:
   (i) identifying a candidate window set in which to search for a cause of the anomalous feature from a set of windows prior to an anomalous window comprising the anomalous feature;
   (ii) for each feature of the measured features of the system circuitry:
      (a) calculating a first feature probability distribution of the respective measured feature for the candidate window set;
      (b) calculating a second feature probability distribution of the respective measured feature for window(s) not in the candidate window set;
      (c) comparing the first feature probability distribution and the second feature probability distribution; and
      (d) identifying the respective measured feature in a timeframe of the candidate window set as the cause of the anomalous feature when the first feature probability distribution and the second feature probability distribution differ by more than a threshold value;
   (iii) iterating steps (i) and (ii) for further candidate window sets from the set of windows prior to the anomalous window; and
   (iv) outputting a signal indicating the measured feature(s) of step (ii)(d) identified as the cause of the anomalous feature.

2. The method of claim 1, wherein the comparing comprises determining a difference measure between the first feature probability distribution and the second feature probability distribution, and
   wherein the identifying comprises identifying that the measured feature in the timeframe of the candidate window set is the cause of the anomalous feature when the difference measure is greater than the threshold value.

3. The method of claim 2, wherein the difference measure is a scaled by a percentile of a difference over time between first feature probability distribution and the second feature probability distribution of the iterations.

4. The method of claim 1, wherein the set of windows prior to the anomalous window is bounded by (i) the anomalous window and (ii) a distal earlier window.

5. The method of claim 4, wherein the calculating of the second feature probability distribution comprises calculating the measured feature for a set of windows between the candidate window set and the anomalous window.

6. The method of claim 1, wherein the candidate window set comprises fewer than 10 windows.

7. The method of claim 6, wherein the candidate window set comprises a single window only.

8. The method of claim 1, wherein the first feature probability distribution and the second feature probability distribution are calculated by fitting a Gaussian model to the measured feature for the identified candidate window set.

9. The method of claim 1, further comprising identifying a measured feature affected by the anomalous feature, the affected measured feature being in a window subsequent to the anomalous window, the method comprising:
   (v) identifying a subsequent candidate window set in which to search for an effect of the anomalous feature from a set of windows subsequent to the anomalous window;
   (vi) for each feature of the measured features of the system circuitry:
      (a) calculating a third feature probability distribution of the respective measured feature for the subsequent candidate window set;
      (b) calculating a fourth feature probability distribution of the respective measured feature for subsequent window(s) not in the subsequent candidate window set;
      (c) comparing the third feature probability distribution and the fourth feature probability distributions; and
      (d) identifying the respective measured feature in a timeframe of the subsequent candidate window set as affected by the anomalous feature when the third feature probability distribution and the fourth feature probability distribution differ by more than a further threshold value; and
   (vii) iterating steps (v) and (vi) for further subsequent candidate window sets from the set of windows subsequent to the anomalous window; and
   (viii) outputting a signal indicating those measured feature(s) of step (vi)(d) identified as affected by the anomalous feature.

10. The method of claim 9, wherein the comparing of the third feature probability distribution and the fourth feature probability distribution comprises determining a further difference measure between the third feature probability distribution and the fourth feature probability distribution, and
    wherein the identifying comprises identifying that the measured feature in the timeframe of the subsequent candidate window set is affected by the anomalous feature when that further difference measure is greater than the further threshold value.

11. The method of claim 10, wherein the further difference measure is a scaled difference over time between the third feature probability distribution and the fourth feature probability distribution.

12. The method of claim 9, wherein the set of windows subsequent to the anomalous window is bounded by (i) the anomalous window and (ii) a distal later window.

13. The method of claim 12, wherein the calculating of the fourth feature probability distribution comprises calculating the measured feature for the set of windows between the subsequent candidate window set and the anomalous window.

14. The method of claim 9, wherein the subsequent candidate window set comprises fewer than 10 windows.

15. The method of claim 14, wherein the subsequent candidate window set comprises a single window only.

16. The method of claim 9, wherein the third feature probability distribution and the fourth feature probability distribution are calculated by fitting a Gaussian model to the measured feature for the identified subsequent candidate window set.

17. The method of claim 1, wherein the measured features comprise features derived from trace data generated by the monitoring circuitry from data outputted by components of the system circuitry.

18. The method of claim 1, wherein the measured features comprise features derived from match events identified by the monitoring circuitry from data inputted to or outputted from components of the system circuitry.

19. The method of claim 1, wherein the measured features comprise features derived from counters of the monitoring circuitry configured to count every time a specific item is observed from components of the system circuitry.

\* \* \* \* \*